United States Patent [19]

Besenhard et al.

[11] Patent Number: 5,705,219
[45] Date of Patent: Jan. 6, 1998

[54] METHOD FOR COATING SURFACES WITH FINELY PARTICULATE MATERIALS

[75] Inventors: Jürgen-Otto Besenhard, Horstmar; Olaf Claussen; Hans-Peter Gausmann, both of Münster; Heinrich Meyer; Hartmut Mahlkow, both of Berlin, all of Germany

[73] Assignee: Atotech Deutschland GmbH, Berlin, Germany

[21] Appl. No.: 616,110

[22] Filed: Mar. 14, 1996

Related U.S. Application Data

[63] Continuation-in-part of Ser. No. 137,097, Dec. 9, 1993, abandoned, and a continuation-in-part of Ser. No. 244,795, Aug. 10, 1994, abandoned.

[30] Foreign Application Priority Data

| Apr. 22, 1991 | [DE] | Germany | 41 13 407.9 |
| Dec. 11, 1991 | [DE] | Germany | 41 41 416.0 |
| Dec. 13, 1991 | [DE] | Germany | 41 41 744.5 |

[51] Int. Cl.$^6$ ............... B05D 5/12; B05D 5/00; B05D 3/04; C25D 3/38
[52] U.S. Cl. ............... 427/96; 427/122; 427/123; 427/197; 427/203; 427/302; 205/291; 216/13; 216/105
[58] Field of Search ............... 427/96, 122, 123, 427/180, 197, 202, 203, 299, 302, 307, 376.1, 198; 205/291; 216/13, 105

[56] References Cited

U.S. PATENT DOCUMENTS

| 3,245,833 | 4/1966 | Trevoy | 427/122 |
| 3,903,328 | 9/1975 | Burdette, Jr. et al. | 427/122 |
| 4,090,984 | 5/1978 | Lin et al. | 252/511 |
| 4,358,474 | 11/1982 | Nakano et al. | 427/122 |
| 4,622,108 | 11/1986 | Polakovic et al. | 204/15 |
| 4,874,479 | 10/1989 | Pendleton | 204/15 |
| 4,920,356 | 4/1990 | Goebel et al. | 427/121 |
| 5,143,592 | 9/1992 | Toro | 205/210 |

FOREIGN PATENT DOCUMENTS

| 2460482 | 11/1975 | Germany | 427/122 |

OTHER PUBLICATIONS

*Hackh's Chemical Dictionary*, Excerpt p. 372 3rd Edition (1944, No Month), McGraw-Hill Book Co., Inc. N.Y.

*Primary Examiner*—Marianne Padgett
*Attorney, Agent, or Firm*—Cohen, Pontani, Lieberman & Pavane

[57] ABSTRACT

A method for coating surfaces of a non-conductor with finely particulate solid particles by substrate-induced coagulation, including the steps of: contacting the non-conductor with a first solution containing a first polar solvent and at least one coagulation initiator comprising high molecular weight material; and, subsequently contacting the non-conductor with a dispersion which contains a second polar solvent and: a) finely particulate solid particles, b) at least one surfactant for preventing the sedimentation of the solid particles, and c) a salt, essentially free of tin ions, for selectively destabilizing the dispersion.

23 Claims, No Drawings

METHOD FOR COATING SURFACES WITH FINELY PARTICULATE MATERIALS

This application is a continuation-in-part of U.S. patent application Ser. No. 08/137,097 filed on Dec. 9, 1993 now abandoned and a continuation-in-part of U.S. patent application Ser. No. 08/244,795 filed Aug. 10, 1994 now abandoned.

BACKGROUND OF THE INVENTION

1. Field of the Invention

The invention relates to a method for coating surfaces of all types, particularly electronically nonconducting surfaces, with highly disperse solid particles of all types, preferably with electronically conducting solid particles by dipping the body to be coated in (a) an aqueous solution of polymers and, subsequently, in (b) an electrolyte-containing dispersion of the solid particles stabilized with surfactants.

2. Description of the Related Art

The coating of surfaces by "dip coating" with "dispersion paints" is a widespread method, which is used in industry above all for coating metals but, in principle, is suitable for coating practically all materials. Common characteristics of typical dispersion paints are solvents and diluents, in which the solid, finely particulate pigments are dispersed, generally with the addition of auxiliaries, which are to prevent settling. Typical dispersion paints also include binders which, after the evaporation of the solvents, frequently also produce, by the additional action of air or of an elevated temperature, a matrix, which adheres to the surface that is to be coated and firmly encloses the pigments. Of course, such dispersion paints can also be applied by methods other than dipping, such as spraying or brushing.

Moreover the viscosity of current dispersion paints must be "adjusted" to be relatively high for dip-coating such paints or applying them by brush on smooth surfaces in order to obtain, after the coating step, a film of adequate thickness and thus with a sufficient amount of pigment. At the same time, it must be accepted as a disadvantage that delicate structures cannot be produced or that pores are "closed off" or that high resolutions in covering fine structures are not possible.

In the Japanese patent 63 317 096, carbon pastes for applying thin electrically conducting layers on insulators are described. The pastes contain finely particulate carbons. Similar pastes for applying heat dissipators on printed circuit boards are described in the Japanese patent 61 202 890. The pastes contain, for example, graphite powder and binders, such as acrylic resins or ethylcellulose. Similar pastes, produced using carbon and gelatin or glue, are also described in the Japanese patent 62 241 929.

"Conductive paints" with carbon and vehicles were also already known. Examples of these are "heating elements, which can be applied by brushing" on walls of buildings (U.S. Pat. No. 4,035,265), graphite or carbon black being used in combination with air-curable binders. Conductive coatings of glass fibers with a dispersion of carbon black in polyacrylate emulsions are described in the U.S. Pat. No. 4,090,984. The U.S. Pat. No. 4,239,794 discloses dispersions of carbon black in solutions, which contain latex as binder, for the conductive coating of fabrics.

If fine structures and particularly pores are to be retained when coated with dispersion of conductive particles, the viscosity of the dispersion and their pigment content must be decreased. With that, however, the thickness of the layer that can be applied by dipping or brushing becomes correspondingly less, the therewith associated lesser coverage of the surface with conductive particles frequently leading to drastically reduced surface conductivities. A subsequent galvanic metallization is then only conditionally possible, since, when the surface conductivity is low, galvanic depositions of metal commence only in the direct vicinity of the power supply and "creep" further forwards only after some considerable time because of the increase in conductivity, which is then brought about by the deposition of metal.

In certain cases, however, coatings of nonconductors by dipping in dispersions of conductive carbon materials of low viscosity can bring about a surface conductivity, which is adequate for galvanic depositions of metal and also usable technically. This is the case particularly for the galvanic metallization of boreholes in copper-laminated printed circuit boards, since for this application it is sufficient if there is a galvanic deposition of metal in the immediate vicinity, typically within a radius of about 2 mm, about the copper lamination used to supply current.

However, such adequate surface conductivities have the disadvantage that a galvanic deposition of metal further away from the contact is not possible or possible only after a longer deposition time. Also, if galvanic coatings do not extend from the start over the whole of the surface, depositions necessarily arise with a very nonuniform thickness, such as "wedge profiles" with a maximum and, usually, unnecessary and undesirable thickness of the wedge at the contact site.

The increase in the surface conductivity is also then a desirable and economically important goal, even though a galvanization basically is possible with far lower surface conductivities, because it saves time and material and improves the quality of the galvanic depositions.

Especially for galvanizing boreholes of copper-laminated printed circuit boards, a series of closely related methods has become known (described, for example, in U.S. Pat. Nos. 4,619,741, 4,622,108, 4,631,117 and 4,684,560). It is a common feature of these methods that the insulating inner walls of the boreholes (as a rule, printed circuit boards consist of glass fiber/epoxy composites) are dipped in solutions, which contain finely particulate, dispersed carbon (preferably acidic carbon black with particle sizes greater than 3 μm) and are coated with a very thin film of carbon. In a subsequent step, the carbon coating is fixed by drying at an elevated temperature, as a result of which a sufficiently conductive layer is formed as a base for the subsequent galvanic copper plating of the boreholes. At the same time, relatively thick layers and corresponding amounts of carbon, which afterwards must be removed once again, are deposited, for example, on the copper surface of the printed circuit board.

The copper surface includes not only the external copper lamination of a printed circuit board, but also the drilled inner layers, which are exposed in the case of multilayers and are contacted by the copper sheath deposited galvanically later on.

Large amounts of carbon have a very disadvantageous effect, particularly in the case of fine boreholes, which can become blocked. In addition, excess carbon must be removed from the copper surfaces in a subsequent bath. In order not to remove the carbon from the nonconductor surfaces, such as epoxide resin, glass, polytetrafluoroethane, polyimide, adhesive and other materials used in the manufacturing of printed circuit boards, a copper etching process is proposed, which takes away up to 5 μm of copper and, at the same time, practically frees the copper surface from carbon. By these means, however, the electrical contact to the carbon lying on the nonconductor is interrupted. In the galvanic bath, the cooper layer must first of all bridge the amount of said 5 μm by front growth, in order to contact, for example, an inner layer of a multilayer. However, since the multilayer consists of several layers, 8 to 16 layers being technically customary, there is such a phenomenon at each layer. As a result, there are considerable fluctuations in the thickness of the copper layer in the borehole, which lead to rejects or, at the very least, represent a significant disadvantage of the method. This inadequacy limits the use of this advantageous technique.

A further disadvantage of the methods within the state of the art is the drying process after the coating with carbon particles. In the case of vertical processing techniques, very much of the carbon dispersion remains in the holes here, particularly in holes with a diameter of less than 0.4 mm. Because the surface of the borehole is therefore difficult to dry and because of the unusually thick coating with carbon, further processing is extremely problematical.

It is also a common feature of all of the above-named methods for metallizing boreholes of printed circuit boards that the carbon is dispersed by using surfactants. According to the teachings of the U.S. Pat. Nos. 4,619,741, 4,631,117 and 4,684,560, the substrates to be coated with carbon are pretreated by means of an aqueous cleaning and conditioning solution, the essential components of which are ethylene glycol and monoethanolamine. In the U.S. Pat. No. 4,622, 108, a cleaning and conditioning solution is described, which contains, aside from ethylene glycol and monoethanolamine, also a nonionic surfactant.

The physical and chemical basis for the adhesion of the carbon particles to the synthetic resin surface are not described in the above-named U.S. patents. In particular, no insight is disclosed into the manner in which the cleaning and conditioning solution affects the adhesion process. Rather, it is pointed out repeatedly that, after the cleaning and conditioning solution is employed, the printed circuit boards must be rinsed thoroughly to remove residues of these solutions (see U.S. Pat. No. 4,684,560, column 5, lines 64/65 and U.S. Pat. No. 4,619,741, column 5, lines 47/48).

On the other hand, a key function can be exercised by the pre-dipping solutions, which are matched to the solid material dispersion, for reaching good coverage of the substrate surface with solid particles.

Specifically effective pre-dipping solutions, with components, which bring about improved adhesion of solid particles on substrate surfaces, have also already been described. For example, M. A. Hubbe (Colloids Surf., 25 [1987] 325) has described that the adhesion forces between titanium oxide hydrates and cellulose or glass can be increased by a factor of 30 by the pretreatment of cellulose or glass with cationic polyelectrolytes. Similar results are reported by S. Varennes and T. G. M. Van de Ven (Colloids surf., 33 [1988] 63) about the increase in the adhesion of latex spheres to glass, which were pretreated with cationic polyelectrolytes ("cat-floc"). Varennes and Van de Ven explain their findings as interaction between opposite charges.

The principle of pretreating the substrates with cationic polyelectrolytes has also already been used for coating printed circuit boards with carbon particles (U.S. Pat. No. 4,874,477).

Up until now, the quality of the adhesion of the carbon particles to the surface of the nonconductor has not been solved satisfactorily.

SUMMARY OF THE INVENTION

It is an object of the present invention to provide a method, with which the adhesion of carbon particles to the surface of nonconductors, particularly the inner walls of boreholes in printed circuit boards, is increased and coating is achieved selectively only where the surface to be coated is covered with a component (A), which interacts with a second component (B) contained in the coating material for achieving the coating effect.

The invention therefore is a method for coating surfaces of all types with highly disperse solid particles of all types. A particular characteristic of the method is that it manages to make do with extremely small amounts of binders and thus has little effect on the functions and properties of the highly disperse solid particles, such as their catalytic activity or electric conductivity. Moreover, within the scope of the inventive method, only low viscosity dispersions of solid particles are used, so that even very fine structures and pores can be coated with a layer of constant thickness, that is, while maintaining "sharp contours" without being "closed off".

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention.

DETAILED DESCRIPTION OF THE PRESENTLY PREFERRED EMBODIMENTS

A central point of the present invention is a method, which leads not only to the absorption of dispersed particles at substrate surfaces, but also to local coagulation exclusively at the substrate surface. For this purpose, the substrate surface must be covered with a material, which initiates the coagulation. In comparison with simple absorption, much larger amounts of particles can selectively be deposited at the surface with this substrate-induced local coagulation.

The success of such a substrate-induced local coagulation which, of course, must not proceed into the bulk of the dispersion, requires a series of measures, which will initially be described in general.

An essential point for the success of the method is the coordination of the two components, a) the coagulation initiator on the substrate and b) the coagulatable dispersion. It is therefore a question of a "two component method", consisting of two solutions, namely a pre-dipping solution and a dispersion of solid particles in a liquid of low viscosity that is matched to said pre-dipping solution.

This dispersion must be conceived differently than conventional dispersion, in which the normally undesirable and frequently irreversible coagulation is prevented, if possible, by the generous use of stabilizers. The inventive dispersions are "barely" stabilized and are brought sufficiently close to the coagulation point especially by the metered addition of selected electrolytes.

However, the sparing use of stabilizing surfactants, which should preferably be anionically or cationically charged for achieving good results, is generally not sufficient for building up dispersions, which then coagulate spontaneously upon contact with a suitable destabilizing material. In the inventive method, therefore, a dispersion is destabilized selectively to such an extent by additives that, under the process conditions, coagulation takes place at the phase boundary.

The selection of surfactant stabilizers which are to prevent the flocculation of the solid particles, is not particularly critical for the functioning of the substrate-induced coagulation. In principle, almost all types of stabilizers are suitable so that, for example, compatibilities with the solid particles, which are to be stabilized, can be taken into consideration.

Likewise, various possibilities exist for selecting salts (electrolytes), which are to be added for the partial destabilization of the dispersions. Good results were achieved with fluorides, chlorides, bromides or iodides of lithium, sodium, potassium, magnesium, calcium, barium, strontium, ammonium or copper; however, nitrates, sulfates or salts of carboxylic acids like acetates are also suitable.

Typical concentrations of the electrolyte additions are of the order of 0.05 moles/L. However, depending on the stabilizer used, significantly higher or lower concentrations may also be appropriate.

Water is a suitable solvent for these dispersions. However, for example, in the case of difficulties with the use of water on the substrate side, other polar solvents, such as alcohols or ketones, can also be used in addition to water or exclusively.

The selection of finely particulate solids, which can be precipitated on surfaces according to the principle of substrate-induced coagulation, is not limited. Aside from various carbon materials, finely divided oxides, such as silica ($SiO_2$), tungsten blue ($H_xWO_3$) or stratified compounds such as $MoS_2$ can also, for example, be induced by the substrate to coagulate.

In order to avoid coagulation exclusively or predominantly in the bulk of the dispersion and, with that, its destruction, the coagulation-initiating material must continue to adhere to the substrate surface. This can be accomplished, particularly, by polymeric coagulation initiators, which can be detached from the surface at least only very slowly. As a result, a possible detaching process is "overtaken" by the coagulation that sets in. Moreover, such macromolecules usually cover far less surface than would have been expected on the basis of their dimensions. Rather, appreciable portions of the molecules in the form of "loops" or "tentacles" frequently protrude into the interior of the solution, as a result of which, compared to small molecules with otherwise similar properties, a drastically increased "reach" of their effectiveness is brought about.

A large number of water-soluble polymers have proven to be suitable for the coagulation-initiating pretreatment of substrates for a substrate-induced coagulation. Evidently, the presence or polarity of a charge does not play a special role. Good results were achieved with gelatin, as well as with polyacrylates, which can carry a certain number of ammonium groups in order to improve their solubility (such as the basoplast types of BASF). Other water-soluble peptides, such as the albumins, are also suitable.

Aside from the high molecular weight materials named, which usually carry a low cationic charge density, numerous other cationically charged polyelectrolytes are also very suitable as coagulation initiators. Examples of such cationically charged polyelectrolytes are copolymers of acrylamide or methacrylamide with salts of quaternized products of aminoacrylates or other polyelectrolytes, which carry a simple or substituted ammonium group. Numerous compounds of this type are on the market as "flocculants" and have names such as Superfloc (American Cyanamid), Etadurin (Akzo), Sedipur (BASF), Magnafloe (Allid Colloids), Nalcolyte (Nalco), Sanfloc (Sanyo) or Separan (Dow Chemical).

Surprisingly, it was found that the cationic polyelectrolytes with a relatively low charge density (<0.5 meq/g) prove to be better coagulation initiators than such polyelectrolytes with a higher charge density. This indicates that simple electrostatic interactions between the "cationic surface" and the anionically stabilized solid particles is not responsible for the adhesion of the latter.

However, not only cationically charged high molecular weight materials are suitable as coagulation initiators. Results, comparable with those obtained by cationic polyelectrolytes, can be obtained with a series of uncharged, water-soluble macromolecules such as polyacrylamides, polyvinylpyrrolidones or polyvinyl alcohols (such as the Mowiol types of Hoechst), having an average molecular weight that is not too low (preferably>10,000 U). Other suitable uncharged macromolecules are, for example, polyethylene glycols and polyethylene glycol ethers, epichlorohydrin-imidazole adducts, polyvinyl imidazoles, polysaccharides such as agar, starch, pectins or dextrans and sugar polymers such as alginic acid.

Finally, a coagulation-initiating effect can also be achieved with anionically charged, high molecular weight materials. Examples of these are the sodium salt of carboxymethylcellulose or the sodium salt of "alginic acid", a copolymer of mannuronic acid and glucuronic acid. Other suitable anionically charged, high molecular weight materials are, for example, alkali salts of polycarboxylic acids, such as polyacrylic acid or polyvinylphosphoric acid.

Proof that the effect, on which the invention is based, cannot simply be attributed to the electrostatic attraction of opposite particles, is based on the fact that a coagulation can be brought about, for example, with cationic coagulation initiators, such as gelatin, at a pH of 3.2 in conjunction with also cationically stabilized particles (compare Examples 3 and 10).

In a quite similar manner, anionically stabilized solid particles can be coagulated on substrates with anionic coagulation initiators, such as alginate or the sodium salt of carboxymethylcellulose (compare Examples 2 and 5).

This being the state of affairs, it is also no longer surprising that anionically and cationically stabilized solid particles can also be coagulated on substrates with coagulation initiators of neutral charge (compare Examples 4, 7, 8, 9, 11 and 14).

Substrate Materials, Which can be Coated by the Substrate-Induced Coagulation of Solid Particles The method of substrate-induced coagulation therefore is not very differentiating with respect to the properties of the material to be coated, that is, practically all materials can be coated in this manner with the inventive method. Actually, the material of the substrate plays only a limited role during the coagulation process. The only prerequisite, which must be fulfilled for the success of the method, is adequate coverage of the substrate surface with a coagulation initiator.

This prerequisite can be fulfilled on practically all substrates with water-soluble polymers. Even the hydrophobic and lipophobic PTFE (Poly tetrafluoro ethylene TEFLON), after being dipped in aqueous solutions of gelatin as coagulation initiator, even after subsequent rinsing with water, still retains sufficient amounts of the coagulation initiator at its surface, that it is coated with a dense layer of carbon black when dipped into carbon black dispersions by the inventive method.

Other synthetic materials, such as the polar epoxides, polyamides, polyimides, phenolic resins, ABS plastics or the nonpolar synthetic materials, such as polyethylene and polypropylene, can be covered with solid particles just like metals and glass.

If a region of selective coverage is desired, it can be achieved by appropriate masks during the dipping into the polymer solution. Regions, which were covered here, are not covered by coagulated particles during the second dipping step. In certain cases, it is also possible to achieve substrate-specific coverages. However, this can be realized only by after-treatments because of the slight substrate specificity of the coagulation process.

It is surprising and noteworthy that the mechanism of the substrate-induced coagulation, which forms the basis for this invention, cannot be interpreted in a trivial manner as an interaction between opposite charges on the substrate surface (brought about, for example, by an adsorbed polymer carrying positive charges) and on the solid particles (brought about, for example, by an anionic surfactant, which carries negative charges).

The embodiments confirm that, surprisingly, a substrate-induced coagulation can take place also when the substrate surface and the suspended particles have the same polarity or are practically not charged. In actual fact, it was possible to observe the effect of substrate-induced coagulation clearly, even if the results were not all equally good, with almost all combinations of substrate-coatings (cationic, anionic, non-ionic and neutral polymers) and stabilizers for the suspended particles (cationic, anionic, nonionic and amphoteric surfactants). Charged surfactants have proven to be better than unchanged surfactants, particularly for stabilizing the solid dispersions.

The low importance of the charge of the polymers, adsorbed on the substrates, is also confirmed owing to the fact that, in the case of a combination of cationic polymers (polyelectrolytes based on acrylamide) on the substrate surface (epoxide) and anionically (Aerosol OT, Cyanamid) stabilized carbon black dispersion (furnace carbon black, Printex L 6, Degussa), the coverage with carbon black is found to be higher as the charge density of the cationic polymers decreases.

A decisive advantage of high molecular weight coagulation initiators over low molecular weight coagulation initiators is the better adhesion to the substrate surface, which results purely statistically already from the large number of possible coordination sites. Moreover, high molecular substances, adsorbed at the surfaces, protrude far into the solution with "loops" and "tentacles", so that their effect is not limited to the immediate surface.

The electrolyte content is an essential component of the "barely" stabilized dispersions suitable for a substrate-induced coagulation. It is well known that, as the electrolyte content increases, the stability of colloidal dispersion decreases, until finally a critical coagulation concentration is achieved (compare, for example, J. Gregory, Material Science Forum, 25/26 [1988] 125). The electrolyte concentrations, suitable for adjusting the dispersions so that they are "barely" stable, must be determined experimentally, the choice of electrolytes not being particularly critical. It is important that, on the one hand, the dispersion is brought close enough to the flocculation limit and that, on the other, sufficient stability is still guaranteed.

It is particularly surprising that a technically reliable and readily controllable process can be carried out the dispersions, which have been deliberately brought close to the coagulation boundary by electrolyte additions. In practice however, the stability windows can readily be located so that, on the one hand, the electrolyte-containing dispersions still have a long shelf life and, on the other, spontaneous coagulation takes place upon contact with the coagulation initiators.

It has already been stated above that significantly thicker layers of solid particles can be deposited with the method of substrate-induced coagulation than with a method based on a simple adsorption. Associated with this is, for example, the higher conductivity of coatings of electron-conducting particles. Moreover, the inventive method of substrate-induced coagulation can be employed on all surfaces, particularly on epoxide resin, on polyimides and even on PTFE (TEFLON).

It remains to be mentioned that the coagulation of the inventive coagulation usually is an irreversible process and that therefore the solid particles, once deposited, adhere sufficiently to withstand an immediately following rinsing process. Such rinsing processes are unavoidable in industry in order to avoid "carry-over" when different baths are used consecutively. On the other hand, competing methods for covering substrates with solid particles by dipping them into dispersions require an additional thermal after treatment for the coating, before a rinsing process or a subsequent galvanic deposition of metal can be carried out (compare, for example, U.S. Pat. Nos. 4,874,477 and 4,622,108).

A further advantage of the "rinse resistance" of layers of solid particles, associated with the irreversible coagulation, lies in the repeatability of the process with the objective of building up particularly thick layers. For example, with the solutions described in Example 8 (A: pre-dipping solution with gelatin, B: rinsing water, C: dispersion of cationically stabilized carbon black with addition of potassium chloride), successive, thick layers of carbon black can be built up on the substrates by the following dipping sequence: A-B-C-B-A-B-C-B-A-B-C . . . etc.

Multiple coating is also possible if, after the coating with the dispersion (step C), there is an intermediate dipping into solutions (I), which brings about the adsorption of insulator layers. Suitable for this purpose are polymer dispersions of higher viscosity, such as concentrated solutions of polyacrylates. With such multiple coatings with insulating intermediate layers, capacitors can be built up.

A further advantage of the inventive method consists therein that it works with materials, which represent no danger whatsoever to health or the environment. The polymeric coagulation initiators are largely literally "edible" and their use is widespread in food technology (for example, gelatin and carboxymethylcellulose). The harmlessness of the surfactant stabilizers for the finely particulate solids has been confirmed in most cases by many years of problem-free use (for example, in personal grooming materials). In addition, no organic solvents are used in the method.

The inventive coating of support materials with functional layers of highly disperse solids takes place within the scope of this invention exclusively by using the method of substrate-induced coagulation. The therewith associated advantages over conventional coating methods permit the advantageous manufacture of different devices, the small proportion of binders in the function layer being a decisive advantage.

For example, solids with catalytic activity, such as finely particulate metals, oxides or complex compounds can be absorbed on support materials while largely retaining their catalytic activity.

In this connection, it is of particular advantage that the process of substrate-induced coagulation enables practically all support materials and all dispersible solids to be used. For example, films, sheets, membrane materials, textiles and foams can be coated with catalytically active substances.

Coating with a colloidal palladium/tin oxide catalyst represents a typical example of the functionalization of substrates with catalysts. Such catalysts are used industrially in order to initiate metallization without external current from solutions of metal ions and a reducing agent. The reduction of the metal then takes place at the colloidal palladium. With this method, it is possible to metallize, for example, synthetic resins if a sufficient amount of the palladium/tin oxide catalyst can be applied on their surface.

It has been observed that, after plastics (such as epoxide resins) or also silicate glasses are pre-dipped in aqueous solutions of polymers (such as gelatin), said substrates are coated far more densely and rapidly with the catalyst upon contact with electrolyte-containing solutions of a colloidal palladium/tin oxide catalyst (Noviganth® AK I, (Schering AG, Berlin now Atotech USA, Inc., Somerset)) than they would be without the pre-dipping step. Since the coating, so obtained, is relatively resistant to rinsing, the substrates, so coated, can be treated with the further solutions, which bring about the metallization without external current. The process as a whole is accelerated appreciably because of the shorter time expended for coating with the catalyst.

Decorative coatings with solid particles can also easily be produced according to the principle of substrate-induced coagulation. However, transparent, protective lacquers are then recommended to protect the surfaces, the solid particle coating of which is frequently only moderately resistant to abrasion. Glass can be tinted according to the principle of substrate-induced coagulation, for example, by coating with nonstoichiometric tungsten oxides $WO_x$ or with molybdenum sulfide. In this connection, particularly the coating with nonstoichiometric oxides, such as $WO_x$, is of great interest, because the color or transparency of such coatings can be changed by an electrochemical potential. By these means, sun-screen glasses, which can be "triggered" electrically, can be built up.

By applying absorbents, such as silica gel ($SiO_2$) used for the preparation of thin-layer chromatographic plates, on smooth substrates such as glass, such thin-layer plates with an extremely thin coating thickness can be obtained. Of course, the principle of substrate-induced coagulation can also be used to coat porous materials of large surface area with special absorbents. Such devices are of importance, for example, in the areas of cleaning and separating gases and liquids.

Coatings with a conductivity that is quite good in comparison with conventional coatings prepared with the help of particles dispersed in solutions, can be produced by the substrate-induced coagulation of conductive, highly disperse solids. The reason for this is the relatively large amount of deposited particles, particularly if use is made of the aforementioned possibility of repeated coating (with intermediate dipping in the solution of the coagulation initiator). However, the small amount of binder, which acts as an insulator, also has an advantageous effect.

The high conductivity of such coatings of solid particles also makes it possible to construct extreme electro-technical or electro-chemical apparatuses. For example, capacitors can be produced by alternately applying layers of good and poor conductivity, the insulating layer being applied, for example, by spraying on soluble or dispersible plastics.

The insulating layer can also have the properties of a thickened or "fixed" or polymeric electrolyte solution. In this case, electrolyte capacitors or batteries and accumulators are formed by the alternate application of conducting and electrolyte layers.

EXAMPLES

The following Examples are intended to explain the inventive method:

Example 1

To begin with, a workpiece of any shape, consisting of duroplastic epoxide resin, is cleaned for two minutes ultrasonically in an aqueous solution containing 0.5% of Arkopal N 150 (HOECHST) and 5% sulfuric acid. The board is then rinsed for 30 seconds with deionized water and pretreated for 30 seconds in a 0.2% aqueous solution of Mowiol 8-88 (HOECHST) at 25° C. with horizontal movement. The solution is prepared by dissolving the solid at 50° C. with stirring.

After the board is rinsed for 30 seconds with deionized water, the adsorptive coating with the Printex L 6 (DEGUSSA) furnace carbon black from a 1% aqueous dispersion is carried out. The carbon black dispersion is stabilized cationically with $3.2 \times 10^{-3}$ moles/L of hexadecyl-trimethylammonium bromide (CTAB) and, in addition, contains 0.05 moles/L of potassium chloride as well as 0.025 moles/L of ethanol. For preparing the dispersion, the water and CTAB are mixed first, the surfactant being added in the form of a solution of one part of CTAB and ethanol in 98 parts of water. The carbon black is stirred into this and subsequently dispersed for 15 minutes with the help of ultrasound. The potassium chloride is then added with stirring in the form of a 1M solution. The dispersion is made up to the final volume and subsequently treated ultrasonically once again for 5 minutes. The coating procedure takes place at a bath temperature of 30° C. with horizontal movement of the boards (stroke: 4 cm, frequency: 75/min); the coating time is 5 minutes. Subsequently, the boards are rinsed with deionized water.

The resulting thin layer of carbon black extends uniformly over the whole of the workpiece. The electrical resistance of the dried layer is of the order of $10^5$ Ω (ohms), based on a square surface. The layer resistance is determined on a standard object of the same material. For this purpose, a 2.8 cm×1.45 cm epoxide printed circuit board (with a thickness of 0.17 cm), which is laminated with copper on both sides and in each case contains boreholes with diameters of 1 mm, 0.8 mm and 0.5 mm, is used. This board is cleaned and coated with carbon in the same way as the workplace. After the board is dried, the resistance R between the copper surfaces is measured. The resistance RQu, related to a square surface, can be calculated from:

$$RQu = R \times [2 \times (2.8 + 1.45) + 10\pi \times (0.1 + 0.08 + 0.05)]/0.17[\Omega]$$
$$= R \times 92.5[\Omega]$$

Example 2

A glass fiber-reinforced epoxide resin board, after being cleaned as in Example 1, is pretreated in a 0.2% solution of the sodium salt of carboxymethylcellulose (FLUKA) at 25° C. for a period of 30 seconds with horizontal movement. The solution is prepared by dissolving the solid with stirring at 70° C. Subsequently, the board is rinsed for 30 seconds with deionized water.

As in Example 1, the surface is coated with Printex L 6. However, the resulting uniform layer of carbon black is thinner and the resistance RQu, determined after drying as in Example 1, is between $10^5$ and $10^6 \Omega$.

Example 3

A workpiece of ABS plastic is cleaned as in Example 1 and rinsed with deionized water. It is pretreated for a period of 30 seconds in a 0.2% solution of gelatin having a pH of 3.2, the workpiece being moved horizontally. For the bath formulation, the gelatin (FLUKA) is permitted to swell for 10 minutes, then dissolved at an elevated temperature, subsequently allowed to stand for 5 hours at 10° C. and thereafter heated to 20° C.

After being rinsed with deionized water, the workpiece is coated in the same way as in Example 1. However, graphitized carbon black of the SIGRI Company is used here. The cationically stabilized dispersion, prepared as in Example 1, now has the following composition: 1% carbon black, $2.5 \times 10^{-3}$ moles/L of CTAB, 0.07 moles/L of potassium chloride, 0.02 moles/L of ethanol.

Example 4

A board of glass fiber-reinforced epoxide resin is cleaned as in Example 1 and rinsed with deionized water. Subsequently, it is pretreated in a 0.2% solution of polyacrylamide (ALDRICH) with horizontal movement for a period of 30 seconds at 25° C. The solution is prepared by dissolving the solid at a temperature of 90° C. with stirring. After that, the board is rinsed with deionized water, once again for 30 seconds.

The board is coated with the Printex L 6 carbon black as in Example 1. However, the dispersion is stabilized anionically with Aerosol OT (CYANAMID). The 1% carbon black dispersion contains $2.7 \times 10^{-3}$ moles/L of Aerosol OT and 0.04 moles/L of potassium chloride. The dispersion is prepared as in Example 1; however, the surfactant is used as a strictly aqueous solution.

The resulting layer is very thin and uniform. The resistance RQu of the dried layer, determined as in Example 1, is of the order of $10^6 \Omega$.

Example 5

A board of glass fiber-reinforced epoxide resin is cleaned as in Example 1. After being timed with deionized water, the board if pretreated for a period of 30 seconds in a 0.2% solution of sodium alginate (SIGMA) at 25° C. with horizontal movement. Subsequently, the board is rinsed with deionized water, once again for 30 seconds.

The surface is then coated with the Printex L6 carbon black from the same anionically stabilized dispersion as in Example 4. The resistance RQu of the uniform thin layer, determined after drying as in Example 1, is found to be approximately $10^6 \Omega$.

Example 6

A board of glass fiber-reinforced epoxide resin is cleaned as in Example 1. After being rinsed with deionized water, the board is pretreated for a period of 30 seconds in a 0.01% solution of the cationic flocculant, Superfloc C 491 (CYANAMID) at 25° C. with horizontal motion. Subsequently, it is rinsed for 30 seconds with deionized water.

The surface is then coated with the Printex L 6 carbon black from an anionically stabilized dispersion as in Example 4. The resistance RQu of the carbon black coating, determined as in Example 1, is found to be about $10^5 \Omega$ after drying.

Example 7

A workpiece of glass is cleaned ultrasonically for 5 minutes at a temperature of 35° C. in an aqueous solution, which contains 0.5% Arkopal N 150 and 1% sodium hydroxide solution. After having been rinsed with deionized water (30 seconds), the workpiece is dipped for a period of 30 seconds in a 0.2% solution of polyvinylpyrrolidone (FLUKA). Subsequently, it is rinsed once against for 30 seconds with deionized water.

This is followed by a deposition of colloidal graphite from the "Aquadag" dispersion (ACHESON), diluted in the ratio of 1:9 and then treated ultrasonically for 15 minutes. The deposition is carried out with horizontal movement of the workpiece at a temperature of 25° C. for a period of 5 minutes. An extremely thin uniform graphite layer, covering the whole of the surface, is formed.

Example 8

An epoxide printed circuit board, which is laminated with copper on both sides and provided with boreholes having a diameter small than 1 mm, is cleaned in an aqueous solution, which contains 0.5% Arkopal N 150 (HOECHST) and 5% sulfuric acid. The cleaning, for which ultrasound is employed simultaneously, requires 2 minutes. The board is then rinsed for 30 seconds with deionized water and pretreated in a 0.2% gelatin solution, also for a period of 30 seconds. The solution is prepared as in Example 3; in addition, however, the pH of the gelatin solution is increased to a value of 7.0 by the addition of sodium hydroxide. Subsequently, the board is rinsed for 30 seconds with deionized water.

The board is coated as in Example 1 in a cationically stabilized dispersion with Printex L 6. However, the dispersion now has the following composition: 0.25% Printex L 6, $8 \times 10^{-4}$ moles/L of CTAB, 0.05 moles/L of potassium chloride and $6.3 \times 10^{-3}$ moles/L of ethanol. After the coating procedure, the board is rinsed with deionized water.

The copper surface, as well as the borehole walls, the surface of which is composed of epoxide resin and glass fibers, are coated completely and uniformly with a thin layer of carbon black. The resistance of RQu of the dried layer, determined as in Example 1, is about $10^5 \Omega$.

Example 9

An epoxide printed circuit board, laminated on both sides with copper and provided with boreholes having a diameter less than 1 mm, is cleaned as in Example 8 and pretreated in a gelatin solution having a pH of 7.

The board is coated as in Example 4 in an anionically stabilized dispersion with Printex L 6. However, the dispersion now has the following composition: 1% Printex L 6, $2.7 \times 10^{-3}$ moles/L of Aerosol OT and 0.04 moles/L of ammonium nitrate.

As in Example 8, the whole of the surface is coated uniformly here also with a thin layer of carbon black. The electrical resistance RQu of the dried layer is less than $10^5 \Omega$.

Example 10

An epoxide primed circuit board, laminated on both sides with copper and provided with boreholes having a diameter less than 1 mm, is cleaned as in Example 3 and pretreated in a gelatin solution having a pH of 3.2. After being rinsed with deionized water, the board is coated as in Example 1 by the deposition of Printex L 6 from a cationically stabilized dispersion. However, the dispersion now has the following composition: 1% Printex L 6, $3.2 \times 10^{-3}$ moles/L of CTAB, 0.025 moles/L of ethanol and 0.08 moles/L of calcium chloride.

Here also, the whole of the surface is coated uniformly with a thin layer of carbon black. The electrical resistance of RQu of the dried layer is of the order of $10^5 \Omega$.

Example 11

A workpiece of polyethylene is cleaned as in Example 1 and pretreated in Mowiol 8-88. After being rinsed with deionized water, the workpiece is coated as in Example 4 in an anionically stabilized dispersion with Printex L 6. However, the dispersion now has the following composition: 1% Printex L 6, $2.7 \times 10^{-3}$ moles/L of Aerosol OT and 0.04 moles/L of potassium sulfate.

After the adhering dispersion is rinsed off, the coating with carbon black can be recognized by the uniform blackening of the surface.

Example 12

A glass plate is cleaned ultrasonically for 2 minutes at a temperature of 30° C. in an aqueous solution, which contains 0.5% Arkopal N 150 and 0.5% sodium hydroxide solution. The plate is pretreated in gelatin solution having a pH of 3.2 as in Example 3 and subsequently rinsed with deionized water.

The plate is then coated with colloidal silicon dioxide ("Aerosil 200", DEGUSSA) by deposition from a 1% aqueous dispersion, which furthermore contains 0.04 moles/L of potassium chloride. The dispersion is prepared with the help of ultrasound. For coating purposes, the pretreated plate is dipped with horizontal motion for a period of 2 minutes into the dispersion at a temperature of 30° C. After being rinsed with deionized water, the plate is dipped once again into the gelatin solution for 30 seconds, rinsed once more and then coated a second time by immersion in the Aerosil 200 so that a coating, which can be recognized by eye, results.

Example 13

A glass plate is cleaned as in Example 12. After being rinsed for 30 seconds with deionized water, it is pretreated as in Example 8 in a gelatin solution having a pH of 7. The plate is then dipped with horizontal motion for a period of 5 minutes at 25° C. into a dispersion of tungsten blue in 0.04M aqueous potassium chloride solution. After rinsing with deionized water, a closed coating of the glass surface with tungsten blue can be recognized.

To prepare 300 mL of the dispersion, 4 g of tungsten (VI) oxide are mixed with zinc and concentrated hydrochloric acid in excess. After about 90 minutes, the deep blue/violet suspension is filtered and the residue washed with deionized water and 12 mL of a 1M solution of potassium chloride are added. The solution is then diluted to the final volume with deionized water. Finally, it is dispersed ultrasonically for a period of 15 minutes.

Example 14

A glass plate is cleaned as in Example 12. After being rinsed for 30 seconds with deionized water, it is pretreated in a gelatin solution of pH 7 and rinsed as in Example 8. After that, the plate is dipped with horizontal motion for a period of 5 minutes at 25° C. into an aqueous dispersion of molybdenum (IV) sulfide having a particle size of less than 1 µm. The dispersion has the following composition: 1% molybdenum (IV) sulfide, $1.1 \times 10^{-3}$ moles/L of Aerosol OT, 0.04 moles/L of potassium chloride; the dispersing is accomplished with the help of ultrasound. After being rinsed with deionized water, the plate is pretreated once again in the same manner in the gelatin solution and dipped for a second time in the dispersion. This procedure is repeated once more.

After rinsing with deionized water, a closed coating of the glass surface with molybdenum (IV) sulfide can be recognized.

Example 15

A glass plate is cleaned ultrasonically for 2 minutes at a temperature of 30° C. in an aqueous solution, which contains 0.5% Arkopal N 150 and 0.5% sodium hydroxide solution. The plate is pretreated as in Example 3 in the gelatin solution having a pH of 3.2 and subsequently rinsed with deionized water.

It is then coated with colloidal silicon dioxide ("Aerosil 200", DEGUSSA), by deposition from a 1% aqueous dispersion, which contains, in addition, 0.04 moles/L of potassium chloride. The dispersion is prepared with the help of ultrasound. For coating purposes, the pretreated plate, moved horizontally, is dipped for a period of 2 minutes into the dispersion at a temperature of 30° C. After being rinsed with deionized water, the plate is dipped once more for 30 seconds into the gelatin solution, rinsed once again and then coated a second time by being dipped into the Aerosil dispersion. This procedure is repeated 3 times. A closed coating of the surface with Aerosil 200, which can be recognized by eye, results.

Example 16

A glass plate is cleaned as in Example 12. After being rinsed for 30 seconds with deionized water, it is pretreated in a gelatin solution of pH 7.0 as in Example 8 and rinsed. The plate is then dipped with horizontal motion for a period of 5 minutes at 25° C. in a dispersion of tungsten blue in 0.04M aqueous potassium chloride solution. After rinsing with deionized water, a closed coverage of the glass surface with tungsten blue can be recognized.

For the preparation of 300 mL of the dispersion, 4 g of tungsten (VI) oxide are mixed with zinc and concentrated hydrochloric acid in excess. After about 90 minutes, the deep blue/violet suspension is filtered, the residue is washed with deionized water and 12 mL of 1M of potassium chloride are added and the filtrate is then made up to volume with deionized water.

Subsequently, it is dispersed for a period of 15 minutes with ultrasound.

Example 17

A glass plate is cleaned as in Example 12. After being rinsed for 30 seconds with deionized water, it is pretreated as in Example 8 in a gelatin solution of pH 7 and rinsed. After that, the plate is dipped with horizontal motion for a period of 5 minutes at 25° C. in an aqueous solution of molybdenum (IV) sulfide having a particle size smaller than 1 µm. The dispersion has the following composition: 1% molybdenum (IV) sulfide, $1.1 \times 10^{-3}$ moles/L of Aerosol OT, 0.04 moles/L of potassium chloride; the dispersion is produced with the help of ultrasound. After being rinsed with deionized water, the plate is pretreated once again in the same manner in gelatin solution, rinsed and dipped a second time into the dispersion. This procedure is repeated once again.

After rinsing with deionized water, a closed coverage of the glass surface with molybdenum sulfide can be recognized.

Example 18

Glass fiber-reinforced epoxide resin boards were copper plated chemically according to the following procedure:

| 1.  | Ultrasonic cleaning                       | 25° C. |
|-----|-------------------------------------------|--------|
| 2.  | Rinsing                                   | 25° C. |
| 3.  | Coagulation initiator[1]                  | 20° C. |
| 4.  | Rinsing[1]                                | 25° C. |
| 5.  | Activation (Noviganth AK I)[1]            | 25° C. |
| 6.  | Rinsing[1]                                | 25° C. |
| 7.  | Fixing (Noviganth AK II)[1]               | 45° C. |
| 8.  | Rinsing[1]                                | 25° C. |
| 9.  | Chemical copper (Noviganth HC)[1]         | 30° C. |
| 10. | Compressed air cleaning[1]                | 20° C. |

[1]These steps of the method are conducted with horizontal motion.

For the ultrasonic cleaning, an aqueous solution is used, which contains 0.5% of Arkopal® N 150 (Hoechst) and 5% sulfuric acid. The treatment time is 2 minutes. The rinsing steps (30 seconds) take place in deionized water.

The coagulation initiator is a 0.2% aqueous solution of gelatin (high gel strength; Fluka; Catalog No. 48274). For preparing the solution, the gelatin, after being allowed to swell for 10 minutes, is first of all dissolved at 60° C., then allowed to stand for 5 hours at 10° C. and then heated to 20° C.

The steps of activating and fixing serve to coat with palladium nuclei. The solutions have the following compositions:

Activator: 25 mL/L of Noviganth® AK I+300 mL/L of HCl+675 mL/L of water (deionized).

Fixing Agent: 100 g/L of Noviganth® AK II+950 mL of water (deionized), Schering AG, Berlin, now Atotech USA Inc., Somerset.

The Noviganth materials are products of Schering AG, Berlin, now Atotech USA Inc., Somerset.

Mixing Sequence: water, hydrochloric acid, Noviganth® AK I.

The chemical copper plating bath has the following composition:

40 mL/L of starting solution Noviganth® HC+8 g/L of NaOH+0.4 mL/L of stabilizer.

Noviganth® HC+15 mL/L of reducing solution Cu+940 mL/L of water (deionized).

The treatment times of steps 3 (coagulation initiator) and 5 (activation) are varied (see Table 1). For checking the experimental results, the resistance of the copper layer is measured.

TABLE 1

Chemical Copper Plating of Glass Fiber-Reinforced Epoxide Resin Boards

| Plate | Coagulation Initiator | Activator | Fixer | Chemical Copper | $R(\Omega/square)$ |
|---|---|---|---|---|---|
| 1a | — | 30 s | 3 min | 1 min | 8.9 |
| 1b | 30 s | 30 s | 3 min | 1 min | 4.5 |
| 2a | — | 1 min | 3 min | 1 min | 5.5 |
| 2b | 36 s | 1 min | 3 min | 1 min | 3.9 |
| 3a | — | 3 min | 3 min | 1 min | 2.2 |
| 3b | 30 s | 3 min | 3 min | 1 min | 2.1 |
| 4a | — | 5 min | 3 min | 1 min | 1.9 |
| 4b | 30 s | 5 min | 3 min | 1 min | 1.8 |

As is evident from Table 1, the time required for the activation can be shortened by using a coagulation initiator. In the case of long activation times, the advantage of the coagulation initiator is leveled out.

Example 19

Glass plates are copper plated chemically (reductively) as in Example 1. For this, the treatment times of steps 3 (coagulation initiator), 5 (activation), 7 (fixing) and 9 (chemical copper) are varied (see Table 2). The experimental results are checked by visual control.

TABLE 2

Chemical Copper Plating of Glass Plates

| Plate | Coagulation Initiator | Activator | Fixer | Chemical Copper |
|---|---|---|---|---|
| 1a | — | 3 min | 3 min | 3 min |
| 1b | 1 min | 3 min | 3 min | 30 s |
| 2 | 1 min | 3 min | 3 min | 1 min |
| 3a | — | 5 min | 5 min | 3 min |
| 3b | 1 min | 5 min | 5 min | 30 s |

Plates 1a and 3a, which are not pretreated with gelatin, are covered less with palladium than plates 1b, 2 and 3b, which are pretreated with coagulation initiator. As a consequence, only a weak, spotty copper layer can be deposited on plates 1a and 3a. On the other hand, a closed coverage with copper is ensured for plates 1b, 2 and 3b. However, the adhesion of the copper layers to the glass surface is only moderate in all cases.

The following Examples are intended to further explain the inventive method.
Outline of the Method as utilized in the following Examples:
1. Cleaning agent; alkaline and/or acidic
2. Rinsing
3. Treatment in solution A
4. Rinsing
5. Treatment in solution B
6. Rinsing
7. Water-soluble polymer
8. Rinsing
9. Carbon dispersion (graphite/carbon black)
10. Rinsing
11. Removal of the copper(I) compound in a weak etching solution
12. Rinsing
13. Drying with air at 50° C.
14. Activating the copper surfaces in an acidic solution
15. Rinsing
16. Galvanic copper 0.5 4 A/dm$^2$ (depending on the application)

Example 20

A printed circuit board, pretreated by the method outlined above, Solution A contains 200 g of copper chloride per liter and Solution B contains 50 g of potassium dihydrogen phosphate per liter.

The pretreated circuit board was then treated with a conditioning solution (water-soluble polymer) of 0.2% MOWIOL® with a pH of 9 and treated further by the method outlined above. MOWIOL® is a trademark of Hoechst Aktiengelsellschaft, Germany, and represents a group of polyvinyl alcohols with different degrees of polymerization.

The copper surfaces were free of carbon already after a few seconds of treatment in the weak etching solution (step 11 in the Outline of the Method). After galvanizing for 5 minutes in an acidic copper bath, the holes were copper plated tightly. No free regions could be identified in the transmitted light test.

Example 21

The adsorptive coating of nonconducting surfaces with conductive carbon blacks is suitable for the through-plating of printed circuit boards based on glass fiber-reinforced epoxide resin plastics and laminated with copper on both sides.

The board, cleaned in 1% ARKOPAL® N 150 (Hoechst) /dilute sulfuric acid with ultrasound, is first pretreated for 15 seconds in a 0.2% aqueous gelatin solution with horizontal movement of the goods. For a bath batch, the gelatin, after being allowed to swell for 10 minutes, is first dissolved at an elevated temperature and subsequently allowed to stand for 5 hours at 10° C. and then heated to 20° C. ARKOPAL® represents a group of surfactants and ARKOPAL® N 150 is a nonylphenolpolyglycolether ($C_8H_{19}$—$C_6H_4$—$(OCH_2CH_2)_{15}H$).

After the board is rinsed with deionized water, it is coated with graphite carbon black of the Sigri company by adsorption from a 1% aqueous dispersion. The dispersing is brought about with ultrasound. The dispersion is stabilized cationically with $2.5 \times 10^{-3}$ moles/L of hexadecyltrimethylammonium bromide (CTAB) and additionally contains 0.07 moles/L of potassium, chloride. The coating takes place at a bath temperature of 30° C. with horizontal movement of the goods (stroke: 4 cm, frequency: 75 per minute) and is completed in 5 minutes.

The board is washed with deionized water and then dried with compressed air. The thickness of the resulting carbon black layer is less than 1 μm and the resistance, based on a square, is of the order of $10^4 \Omega$. To remove the carbon black coating on the copper lamination, the plate is etched anodically for 5 minutes with 1 A/dm$^2$ in 0.5 moles/L of CuSO$_4$/

H₂SO₄ and rinsed once again. After that, it is galvanized in the usual manner.

Example 22

An epoxide or glass plate is coated with graphite as described in Examples 20 and 21. After the last rinsing, however, the plates are dried in an oven for 15 minutes and tempered. For epoxide boards the temperature is 120° C. and for glass plates 200° C. The conductivity of the graphite layers is increased by this treatment, so that the galvanic deposition of copper proceeds more quickly. By these means, it is also possible to galvanize larger workpieces, particularly of glass.

Example 23

A glass plate (2 cm high, 2 cm wide) is coated with a polymer. As polymer, the binder of the BASF electrophoretic enamel "CATHODIP®", which is a water-dilutable dispersion (product number FT 83-0270), is used as a polymer. The dispersion is applied by immersing the plate in the 1:1 diluted polymer dispersion and subsequently drying for 5 minutes at 80° C. The transparent, adhering layer is water resistant and shows hydrophobic behavior. Thereupon, the procedure of Example 20 is followed and, after the graphite coating, copper is deposited galvanically. The metallization on this surface shows a better adhesion strength than the metallization on glass that has not been coated with polymer. A further increase in adhesion is achieved due to the cross linking of the polymer after the galvanization. It takes place while storing at a temperature of 180° C. for a period of 15 minutes.

Example 24

A glass plate, 2 cm high, 2 cm wide, is coated with a water-insoluble gelatin layer from a 0.5% gelatin solution, which contains 0.5% formaldehyde, by briefly immersing the plate in the solution at a temperature of 20° C. and subsequently drying it with compressed air. Without any further pretreatment, the plate is coated with graphite by adsorption from the dispersion at a temperature of 25° C. for 2 minutes with movement of the plates. The plates are then rinsed and dried with compressed air. After that, the plates are dipped for a second time, again for 2 minutes, into the graphite dispersion and dried once more. This procedure is repeated twice more. Subsequently, the plates are copper plated galvanically in the usual manner.

The invention is not limited by the embodiments described above which are presented as examples only but can be modified in various ways within the scope of protection defined by the appended patent claims.

We claim:

1. A method of coating a surface of a nonconductor substrate with particulate solid particles by substrate-induced coagulation, comprising steps of:
   (a) treating the nonconductor substrate with a first solution containing a first polar solvent and at least one coagulation initiator comprising a soluble polymer so that the coagulation initiator adheres to the substrate; and,
   (b) subsequently coagulating the particulate solid particles on the non-conductor substrate by contacting the substrate treated in step (a) with a dispersion containing a second polar solvent and:
      i) the particulate solid particles,
      ii) at least one surfactant for preventing sedimentation of the solid particles prior to the coagulation, and
      iii) a salt for promoting destabilization of the dispersion during the coagulation, and wherein the first and second polar solvent are the same or different.

2. The method of claim 1, wherein the solid particles are electron-conducting solid particles.

3. The method of claim 1, wherein the solid particles are selected from the group consisting of graphite and carbon black.

4. The method of claim 2, wherein the non-conductor surface is coated with the electron-conducting solid particles in an amount sufficient to permit a subsequent galvanic deposition of metal.

5. The method of claim 1, wherein the soluble polymer is selected from the group consisting of water-soluble proteins and polysaccharides.

6. The method of claim 1, wherein the soluble polymer comprises a natural product or derivative thereof selected from the group consisting of soluble proteins and polysaccharides.

7. The method of claim 1, wherein the soluble polymer is a soluble synthetic polymer.

8. The method of claim 1, wherein the soluble polymer is selected from the group consisting of polyelectrolytes with a positive or negative charge and betaines which simultaneously carry positive and negative charges.

9. The method of claim 1, wherein the surfactant for preventing the sedimentation of the solid particles is selected from the group consisting of anionic, cationic, amphoteric and nonionic surfactants.

10. The method of claim 1, wherein the salt contained in the dispersion is selected from the group consisting of halides, borates, carbonates, nitrates, phosphates, sulfates, acetates and chlorates of inorganic monovalent, divalent and trivalent cations.

11. The method of claim 1, wherein the nonconductor substrate is selected from the group consisting of synthetic resins and composites thereof.

12. The method of claim 11, wherein the synthetic resins are selected from the group consisting of epoxide resins, polyimide resins and polytetrafluoroethylene and the composites are reinforced with glass fibers.

13. The method of claim 1, wherein the solid particles are applied on a wall of an electronic component and comprising an additional step of depositing a metal on the wall after the coagulation of the solid particles.

14. The method of claim 1, wherein the solid particles are applied on a wall of a borehole in a printed circuit board and comprising an additional step of galvanically depositing a metal on the wall after the coagulation of the solid particles.

15. The method of claim 14, wherein the circuit boards are multilayer printed circuit boards.

16. The method of claim 1, wherein the first solution contains a bactericidal substance.

17. The method of claim 1, wherein the step of contacting the nonconductor substrate with the dispersion includes contacting with a dispersion having one of anionic surfactants, cationic surfactants and phase-transfer catalysts as a wetting agent.

18. The method of claim 1, wherein the substrate comprises a copper surface adjacent nonconductor surface and further including a step of treating the nonconductor surface prior to step (b) with a copper (II) solution.

19. The method of claim 1, wherein the salt comprises one of fluorides, chlorides, bromides and iodides of one of lithium, sodium, potassium, ammonium, magnesium, calcium, barium, strontium, and copper.

20. The method of claim 3, wherein the solid particles are selected from the group consisting of the graphite with an average particle size less than 50 μm and the carbon black with an average particle size less than 5 μm.

21. The method of claim 1, and further comprising steps of rinsing the nonconductor substrate after the coagulating step, drying the nonconductor substrate, coated with the particulate solid particles, after the rinsing step, and then galvanically metallizing the nonconductor substrate.

22. The method of claim 21, wherein the nonconductor substrate comprises a copper surface and further including a step of etching the copper surface, coated with the particulate solid particles, with a copper etching solution before said drying step.

23. The method of claim 1, comprising an additional step of rinsing the nonconductor substrate after step (a) and prior to performing step (b).

* * * * *